United States Patent
Oh

(10) Patent No.: US 11,923,388 B2
(45) Date of Patent: Mar. 5, 2024

(54) IMAGE SENSING DEVICE

(71) Applicant: SK hynix Inc., Icheon-si (KR)

(72) Inventor: Sun Ho Oh, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 226 days.

(21) Appl. No.: 17/202,104

(22) Filed: Mar. 15, 2021

(65) Prior Publication Data

US 2022/0052089 A1  Feb. 17, 2022

(30) Foreign Application Priority Data

Aug. 12, 2020 (KR) .................. 10-2020-0101077

(51) Int. Cl.
*H01L 27/146* (2006.01)
*H04N 25/75* (2023.01)

(52) U.S. Cl.
CPC .. *H01L 27/14621* (2013.01); *H01L 27/14629* (2013.01); *H01L 27/14645* (2013.01); *H01L 27/14627* (2013.01); *H04N 25/75* (2023.01)

(58) Field of Classification Search
CPC ......... H01L 27/14621; H01L 27/14629; H01L 27/14645; H01L 27/14627; H01L 27/14603; H01L 27/14623; H04N 25/11; H04N 25/75
See application file for complete search history.

(56) References Cited

U.S. PATENT DOCUMENTS

| | | |
|---|---|---|
| 9,437,645 B1 | 9/2016 | Chou et al. |
| 2013/0038761 A1 | 2/2013 | Tanaka et al. |
| 2014/0253850 A1 | 9/2014 | Lee et al. |
| 2014/0313379 A1 | 10/2014 | Mackey |
| 2016/0035775 A1* | 2/2016 | Choi ................. H01L 27/14627 257/432 |
| 2016/0276395 A1 | 9/2016 | Chou et al. |
| 2017/0077163 A1 | 3/2017 | Chou et al. |
| 2017/0092671 A1 | 3/2017 | Yang |
| 2018/0040656 A1* | 2/2018 | Jang ................. H01L 27/14621 |
| 2018/0076247 A1 | 3/2018 | Pang et al. |
| 2018/0090538 A1 | 3/2018 | Wang et al. |
| 2020/0043962 A1* | 2/2020 | Cho .................... H01L 27/1463 |

(Continued)

FOREIGN PATENT DOCUMENTS

| | | |
|---|---|---|
| CN | 106158891 A | 11/2016 |
| CN | 107039468 A | 8/2017 |
| CN | 108183116 A | 6/2018 |

(Continued)

*Primary Examiner* — Meiya Li
(74) *Attorney, Agent, or Firm* — Perkins Coie LLP

(57) ABSTRACT

An image sensing device includes a semiconductor substrate, a plurality of photoelectric conversion elements supported by the semiconductor substrate, each photoelectric conversion elements configured to generate an electrical signal corresponding to incident light by performing a photoelectric conversion of the incident light, a plurality of color filters disposed over the semiconductor substrate to filter incident light to be received by the photoelectric conversion elements, each color filter configured to allow light having a specific color to pass therethrough, and a grid structure disposed between the color filters and structured to include asymmetric sidewalls that are shaped based on colors of adjacent color filters.

17 Claims, 13 Drawing Sheets

(56) References Cited

U.S. PATENT DOCUMENTS

2020/0075653 A1    3/2020  Seki et al.
2021/0066374 A1\*  3/2021  Kim .................. H01L 27/14621

FOREIGN PATENT DOCUMENTS

| CN | 110197832 A | 9/2019 |
|----|-------------|--------|
| CN | 110335879 A | 10/2019 |
| JP | 2018133575 A | 8/2018 |
| KR | 10-1093241 B1 | 12/2011 |
| KR | 10-2016-0015095 A | 2/2016 |

\* cited by examiner

IMAGE SENSING DEVICE

CROSS-REFERENCE TO RELATED APPLICATION

This patent document claims the priority and benefits of Korean patent application No. 10-2020-0101077, filed on Aug. 12, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to an image sensing device for correcting a difference in sensitivity between colors of color filters so as to more easily implement a high dynamic range (HDR).

In accordance with an embodiment of the disclosed technology, an image sensing device may include a semiconductor substrate, a plurality of photoelectric conversion elements supported by the semiconductor substrate, each photoelectric conversion elements configured to generate an electrical signal corresponding to incident light by performing a photoelectric conversion of the incident light, a plurality of color filters disposed over the semiconductor substrate to filter incident light to be received by the photoelectric conversion elements, each color filters configured to allow light having a specific color to pass therethrough, and a grid structure disposed between the color filters and structured to include asymmetric sidewalls that are shaped based on colors of adjacent color filters.

In accordance with another embodiment of the disclosed technology, an image sensing device may include a color filter layer including a plurality of color filters configured to allow light of a certain color to pass therethrough, and a grid structure disposed between the color filters. The plurality of color filters may include a first color filter having a first size, and second color filters having a second size greater than the first size. The grid structure may include a first grid structure arranged in contact with the first color filter and configured to have a first width, and a second grid structure arranged in contact with the second color filters and configured to have a second width smaller than the first width. The first grid structure has asymmetric sidewalls.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device and the disclosed features may be implemented to achieve one or more advantages in certain imaging applications. Some implementations of the disclosed technology suggest designs of an image sensing device which can correct a difference in sensitivity between colors of color filters so as to more easily implement a high dynamic range (HDR). The disclosed technology provides various implementations of an image sensing device which can be used to correct a difference in sensitivity between colors of the color filters using a grid structure, and can thus more easily implement a high dynamic range (HDR) using a grid structure.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
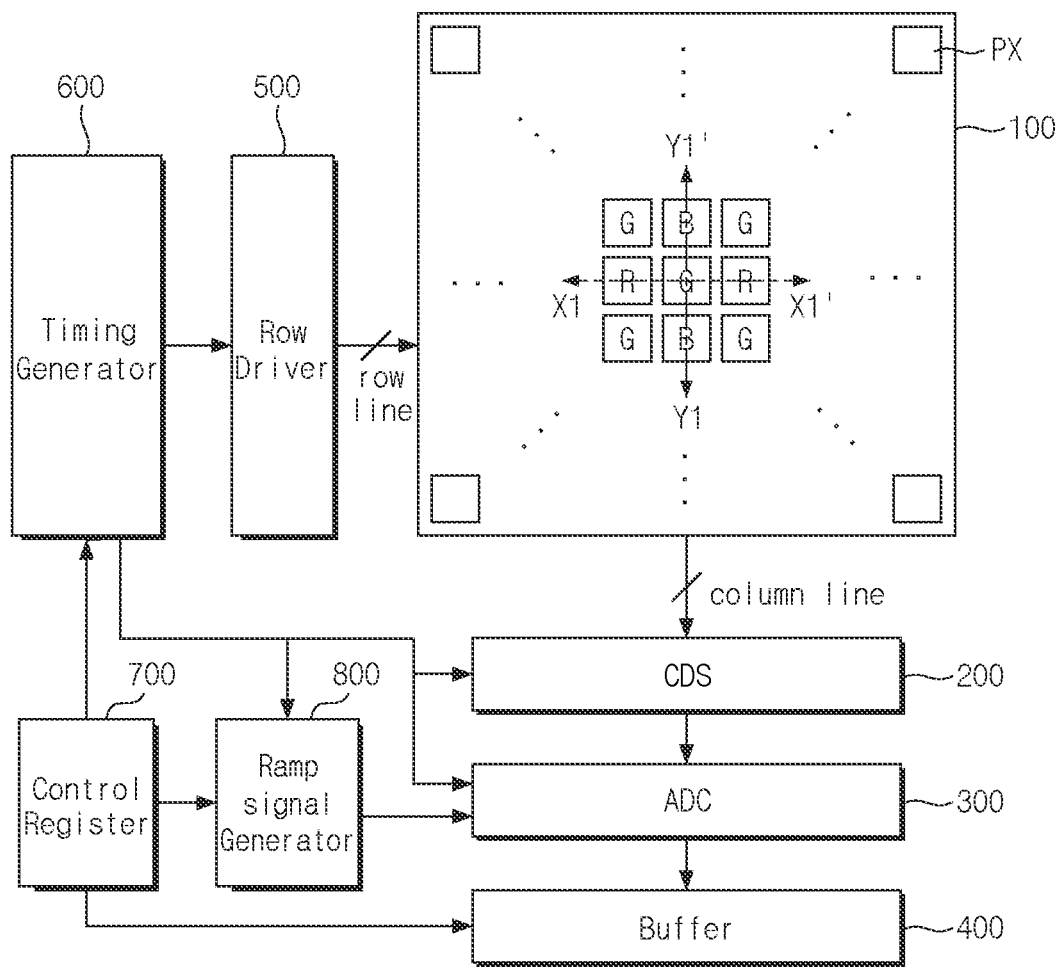
FIG. 1 is a schematic diagram illustrating an example layout of an image sensing device based on some implementations of the disclosed technology.

FIG. 1 is a block diagram illustrating an example of an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of unit pixels (PXs) consecutively arranged in a two-dimensional (2D) structure in which the unit pixels (PXs) are arranged in an X-axis direction and a Y-axis direction perpendicular to the X-axis direction. Each unit pixel (PX) may generate an electrical signal (i.e., pixel signal) corresponding to incident light through photoelectric conversion of the incident light received from the outside, and may output the pixel signal to the correlated double sampler (CDS) 200 through column lines. The plurality of unit pixels (PXs) may include red (R) color filters, green (G) color filters, and blue (B) color filters, which are arranged in a Bayer pattern. A grid structure may be formed between adjacent color filters, such that the grid structure can prevent crosstalk between adjacent color filters. In some implementations, the grid structure may be formed in an asymmetric structure that has different structures depending on colors of the color filters. A detailed description of the grid structure will be given at a later time.

As discussed above, each unit pixel PX may output the pixel signal to the correlated double sampler (CDS) 200. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 200 may sequentially sample and hold voltage levels of the reference signal and the image signal, which are provided to each of a plurality of column lines from the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may be used to convert analog CDS signals to digital signals. In some implementations, the ADC 300 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 300 may convert the correlate double sampling signal generated by the CDS 200 for each of the columns into a digital signal, and output the digital signal. The ADC 300 may perform a counting operation and a computing operation based on the correlate double sampling signal for each of the columns and a ramp signal received from the ramp signal generator 800. In this way, the ADC 300 may eliminate or reduce noises such as reset noise arising from the imaging pixels when generating digital image data.

The ADC 300 may include a plurality of column counters. Each column of the pixel array 100 is coupled to a column counter, and image data can be generated by converting the correlate double sampling signals received from each column into digital signals using the column counter. In another embodiment of the disclosed technology, the ADC 300 may include a global counter to convert the correlate double sampling signals corresponding to the columns into digital signals using a global code provided from the global counter.

The buffer 400 may temporarily hold or latch each of the digital signals received from the analog-to-digital converter (ADC) 300, may sense or detect and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels PXs. The sense amplifier may sense and amplify each count value received from the memory.

The row driver 500 may be used to drive the pixel array 100 in response to an output signal of the timing generator 600. In some implementations, the row driver 500 may select one or more imaging pixels arranged in one or more rows of the pixel array 100. The row driver 500 may generate a row selection signal to select one or more rows among the plurality of rows. The row driver 500 may sequentially enable the pixel reset signal for resetting imaging pixels corresponding to at least one selected row, and the transmission signal for the pixels corresponding to the at least one selected row.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal in response to a control signal of the control register 700 and a timing signal received from the timing generator 600, and may output the ramp signal to the analog-to-digital converter (ADC) 300.

Figure 2A:
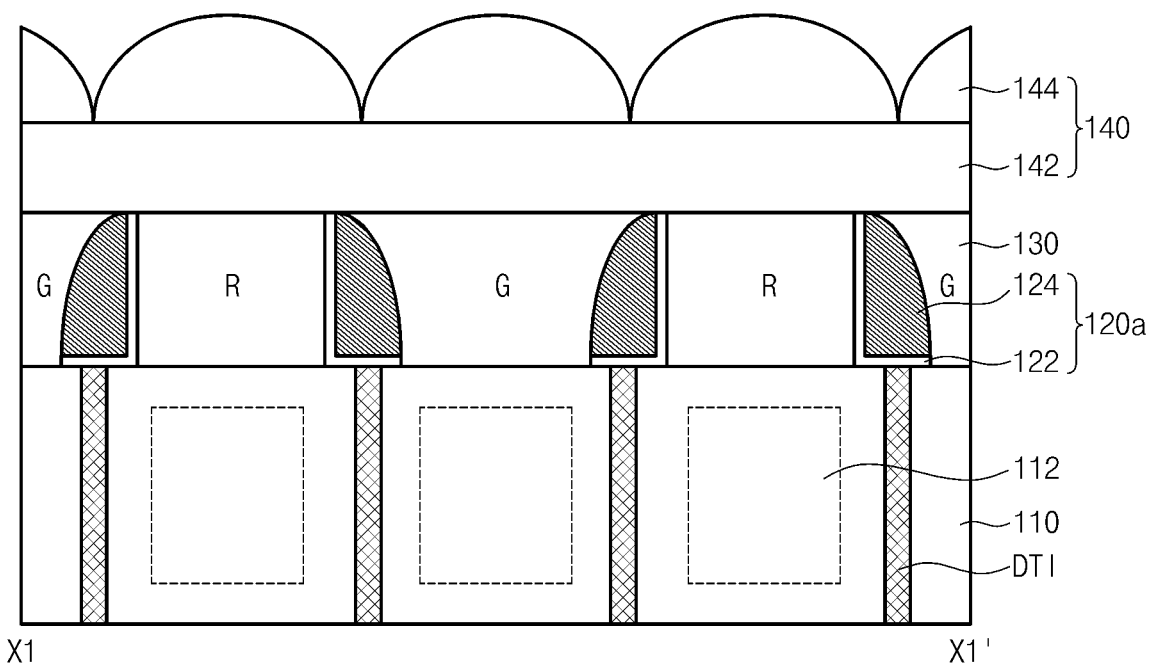
FIG. 2A is a cross-sectional view illustrating an example of a pixel array taken along the line X1-X1' shown in FIG. 1 based on some implementations of the disclosed technology.
Figure 2B:
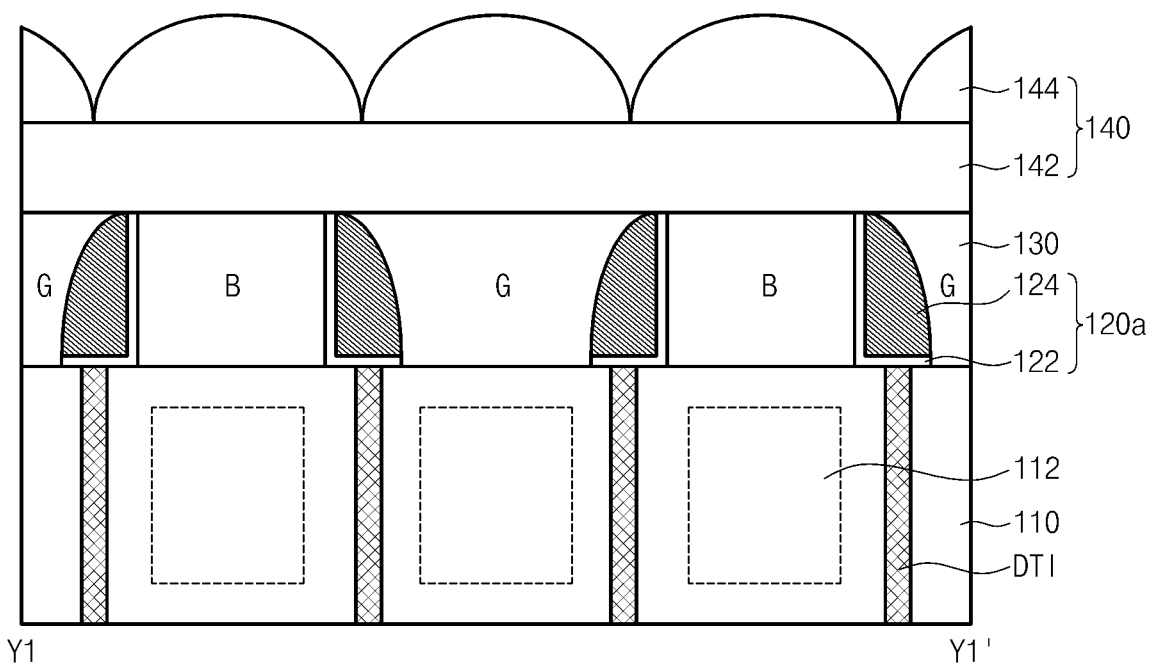
FIG. 2B is a cross-sectional view illustrating an example of a pixel array taken along the line Y1-Y1' shown in FIG. 1 based on some implementations of the disclosed technology.

FIG. 2A is a cross-sectional view illustrating an example of a pixel array 100 taken along the line X1-X1' shown in FIG. 1 based on some implementations of the disclosed technology. FIG. 2B is a cross-sectional view illustrating an example of the pixel array 100 taken along the line Y1-Y1' shown in FIG. 1 based on some implementations of the disclosed technology.

Referring to FIGS. 2A and 2B, a semiconductor substrate 110 may include a first surface and a second surface facing away from each other. The semiconductor substrate 110 may be in a monocrystalline state, and may include a silicon-containing material. For example, the semiconductor substrate 110 may include a monocrystalline silicon-containing material. The semiconductor substrate 110 may include photoelectric conversion elements 112, each of which is formed to correspond to each unit pixel PX. The photoelectric conversion elements 112 may generate electric signals corresponding to incident light by performing photoelectric conversion of the incident light. Each of the photoelectric conversion elements 112 may include a photodiode. A device isolation layer (not shown) may be formed between the photoelectric conversion elements 112. The device isolation layer may include a trench-shaped device isolation layer such as a Deep Trench Isolation (DTI) structure.

A grid structure 120a, a color filter layer 130, and a lens layer 140 may be sequentially formed over the first surface of the semiconductor substrate 110.

The grid structure 120a may be formed between the color filters R, G, and B to prevent crosstalk between adjacent color filters. Thus, the grid structure 120a may be formed between any two adjacent color filters R, G, and B. The grid structure 120a may include a first metal layer 122 and a second metal layer 124. The grid structure 120a may have an asymmetric shape or structure. For example, referring to FIG. 2A, the gird structure 120a may be positioned between the red color filter R and the green color filter G and have asymmetric sidewalls. For example, in the grid structure 120a, a sidewall contacting the green color filter (G) having a high sensitivity to light may have a rounded profile with a curvature. In the grid structure 120a, a sidewall contacting the red color filter (R) and a sidewall contacting the blue color filter (B), each of which has a relatively lower sensitivity to light as compared to the green color filter (G), may have a vertical profile. Thus, the grid structure 120a has sidewalls that have different profile/shapes depending on colors of color filters that are disposed to be contact with the sidewalls.

This unique design of the grid structure 120a in an asymmetric structure in connection with the colors of the adjacent color filters is based on the recognition that the shapes of the grid structure can impact the imaging operation in dealing with colored images.

The color filters (R, G, B) have different sensitivity to light based on colors of the color filters (R, G, B). In general, the image sensing device can correct a sensitivity difference between colors in a signal processing process. However, such correction through the signal processing process may be not sufficient if a sensitivity difference between two different colors is not within a certain level. For example, a sensitivity difference between the blue color filter (B) and the green color filter (G) or a sensitivity difference between the red color filter (R) and the green color filter (G) is pretty big and the correction using the signal processing process may have difficulties in correcting such big sensitivity difference. In this case, the color representation of the image sensing device may be greatly affected even with a small error generated in a fabrication process.

Therefore, some implementations of the disclosed technology suggest reducing the amount of light that flows into the photoelectric conversion elements of the substrate 110 after passing through the green color filter (G). By reducing the amount of light passing through the green color filter (G), a sensitivity difference between the blue color filter (B) and the green color filter (G) and a sensitivity difference between the red color filter (R) and the green color filter (G) can be reduced. To this end, the grid structure 120a of the image sensing device may be formed in an asymmetric shape/profile.

For example, in some implementations, the grid structure 120a may have a sidewall adjacent to the red color filters (Rs) or the blue color filters (Bs) and having a vertical profile, and have a sidewall adjacent to the green color filters (Gs) and having a rounded profile. The sidewall having a rounded profile may generate a relatively larger amount of scattered reflection (or diffused reflection) of light as compared to the sidewall having a vertical profile. As a result, scattered reflection (diffused reflection) of light rays is intentionally induced for the light incident upon the green color filters (Gs), such that the amount of light flowing into the photoelectric conversion elements 112 through the green color filters (Gs) can be reduced.

In some implementations, the sidewalls of the grid structure 120a (e.g., sidewalls having a rounded profile) that are adjacent to the green color filters (Gs) may include materials having different reflection rate (that can be called as reflectivity or reflection index) from that of materials of the sidewalls of the grid structure 120a (e.g., sidewalls having a vertical profile) contacting the red color filters (Rs) and the blue color filters (Bs). For example, each of the sidewalls having a vertical profile may include a first metal layer 122, and each of the sidewalls having a rounded profile may include a second metal layer 124 that has a lower reflection index (i.e., lower reflectivity) than the first metal layer 122. The first metal layer 122 may extend to a region between a bottom surface of a second metal layer 124 and the first surface of the semiconductor substrate 110, such that the first metal layer 122 can be in contact with the bottom surface of the second metal layer 124. The first metal layer 122 may include a barrier metal including at least one of titanium (Ti) and titanium nitride (TiN). The second metal layer 124 may include a metal such as tungsten (W).

The grid structure 120a may allow incident light received through the green color filters (Gs) to be absorbed in the grid structure 120a more easily than incident lights received through either the red color filters (Rs) or the green color filters (Bs), such that the amount of light flowing into the photoelectric conversion elements 112 through the green color filters (Gs) can be greatly reduced.

The color filter layer 130 may include the plurality of color filters (e.g., RGB filters), each of which is formed to selectively transmit only visible light having a specific color from among incident light. For example, the color filter layer 130 may include a plurality of red color filters (Rs), a plurality of green color filters (Gs), and a plurality of blue color filters (B s). Each red color filter (R) may transmit only red light from among RGB lights of visible light. Each green color filter (G) may transmit only green light from among RGB lights of visible light. Each blue color filter (B) may transmit only blue light from among RGB lights of visible light. Each of the color filters R, G, and B may be formed per unit pixel (PX). The red filters (Rs), the green filters (Gs), and the blue filters (Bs) may be regularly arranged in a Bayer pattern. The color filters (R, G, B) may be formed in a region defined by the grid structure 120a.

The red color filters (Rs) may include a polymer organic material including a red pigment, the green color filters (Gs) may include a polymer organic material including a green pigment, and the blue color filters (B s) may include a polymer organic material including a blue pigment. For example, each of the color filters (R, G, B) may include a resist material.

The lens layer 140 may include an over-coating layer 142 and a plurality of microlenses 144. The over-coating layer 142 and the microlenses 144 may be formed of the same materials.

The over-coating layer 142 may be formed over the grid structure 120a and the color filter layer 130. The over-coating layer 142 may operate as a planarization layer to compensate for (or remove) a step difference caused by the grid structure 120a and the color filter layer 130.

The microlenses 144 may be formed over the over-coating layer 142. Each of the microlenses 144 may be formed in a hemispherical shape, and may be formed per unit pixel (PX). The microlenses 144 may converge incident light, and may transmit the converged light to the color filters (R, G, B) of the corresponding unit pixel.

FIGS. 3A to 3E are cross-sectional views illustrating examples of processes for forming the structure shown in FIG. 2A based on some implementations of the disclosed technology. The processes as shown in FIGS. 3A to 3E can be applied for forming the structures shown in FIGS. 2A and 2B.

Figure 3A:
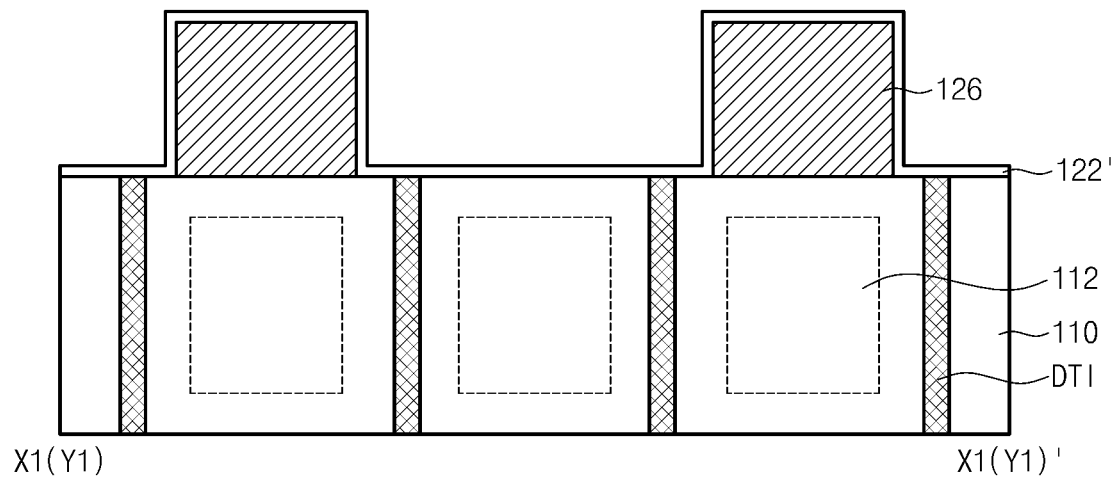
FIGS. 3A to 3E are cross-sectional views illustrating examples of processes for forming the structure shown in FIG. 2A based on some implementations of the disclosed technology.

Referring to FIG. 3A, over the first surface of the substrate 110 including the photoelectric conversion elements 112, at least one partition pattern 126 may be formed in a region to be used for the red color filters (Rs) and a region to be used for the blue color filters (Bs). For example, based on the Bayer pattern, the partition patterns 126 may be formed in regions to be used for the red color filters (Rs) and the blue color filters (Bs) and the partition patterns 126 may be not formed in regions to be used for the green color filters (Gs). In some implementations, each of the partition patterns 126 may include a nitride layer.

Subsequently, a first metal layer 122' may be formed over the partition pattern 126 and the substrate 110. The first metal layer 122' may include a barrier metal including at least one of titanium (Ti) and titanium nitride (TiN).

Figure 3B:
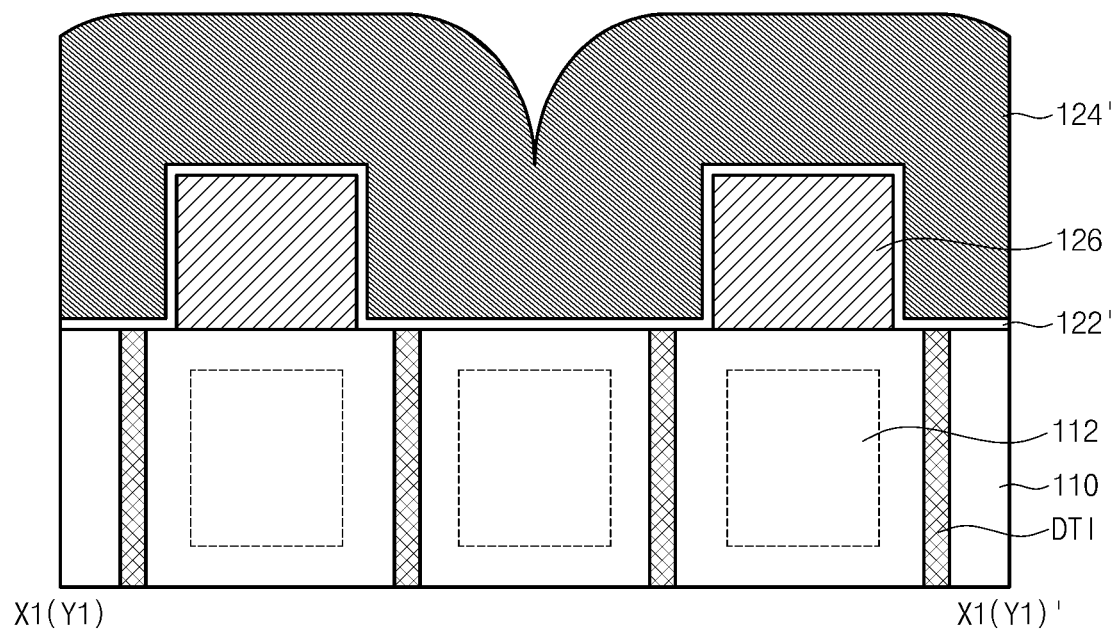

Referring to FIG. 3B, a second metal layer 124' may be formed over the first metal layer 122'. The second metal layer 124' may be formed of or include a material layer having a lower reflection index (i.e., lower reflectivity) than the first metal layer 122'. For example, the second metal layer 124' may include a metal such as tungsten (W).

Figure 3C:
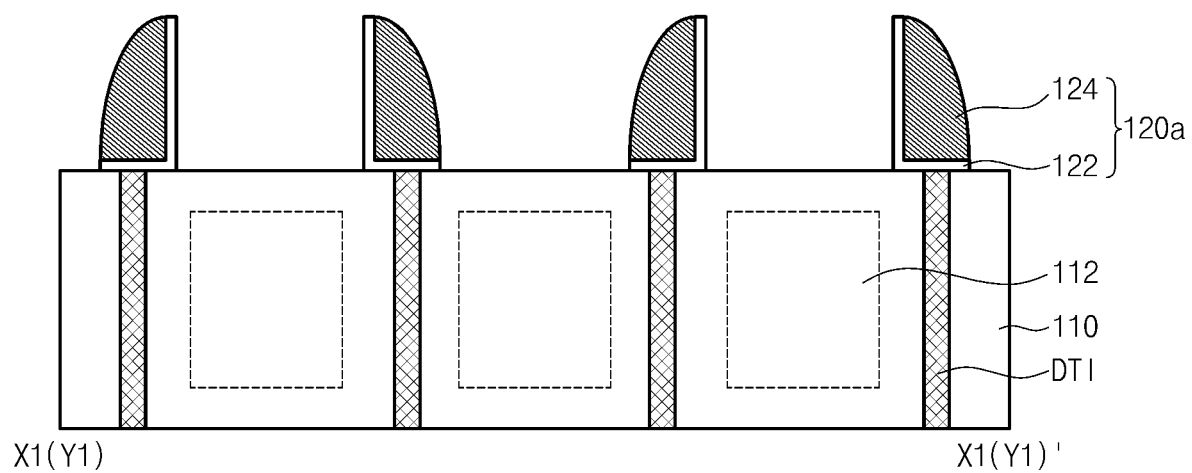

Referring to FIG. 3C, anisotropic etching may be performed on the second metal layer 124' and the first metal layer 122' until the substrate 110 and the partition pattern 126 are exposed. Therefore, the grid structure 120a may be formed in each sidewall of the partition pattern 126. Here, the inner sidewall of the grid structure 120a may have a vertical profile, and the outer sidewall of the grid structure 120a may have a rounded profile.

Subsequently, the exposed partition pattern 126 may be selectively removed (or etched). For example, only a certain partition pattern 126 may be selectively removed through an etching process based on etch selectivity.

Figure 3D:
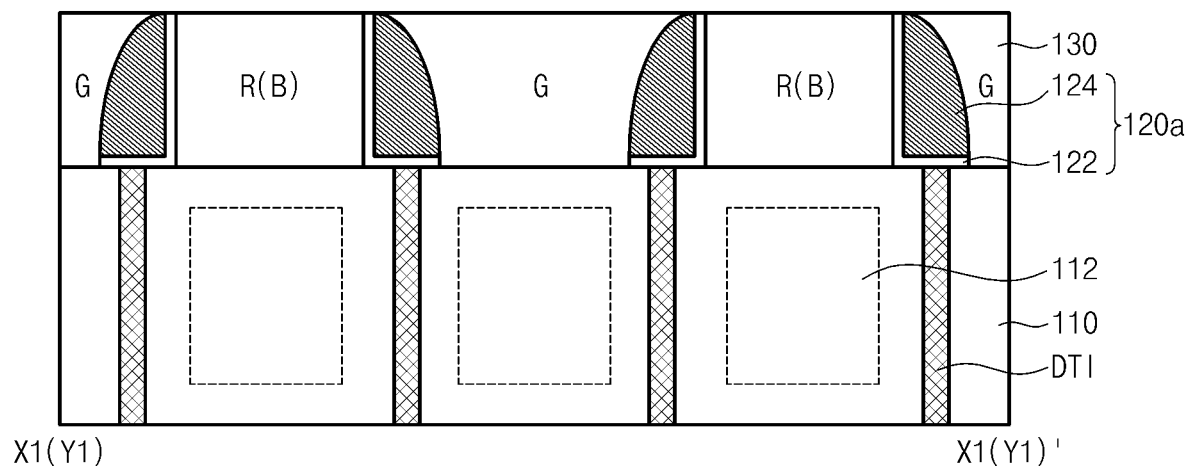

Referring to FIG. 3D, the color filters (R, G, B) may be formed in regions defined by the grid structures 120a. For example, after a resist layer having a red color (i.e., a red resist layer) is formed in the regions defined by the grid structures 120a, the red resist layer may be exposed and developed in a manner that the red resist layer remains only at a position corresponding to the red color filter (R) based on the Bayer pattern. Subsequently, after a green resist layer is formed to gapfill spaces between the red color filters (Rs), the green resist layer may be exposed and developed in a manner that the green resist layer remains only at a position corresponding to the green color filter (G) based on the Bayer pattern.

In this case, the green color filters (Gs) may be surrounded by some sidewalls each having a rounded profile from among the sidewalls of the grid structure 120a.

Thereafter, after a blue resist layer is formed to gapfill spaces between the red color filters (Rs) and the green color filters (Gs), the blue resist layer may be exposed and developed in a manner that the blue resist layer remains only at a position corresponding to the blue color filter (B) based on the Bayer pattern.

Figure 3E:
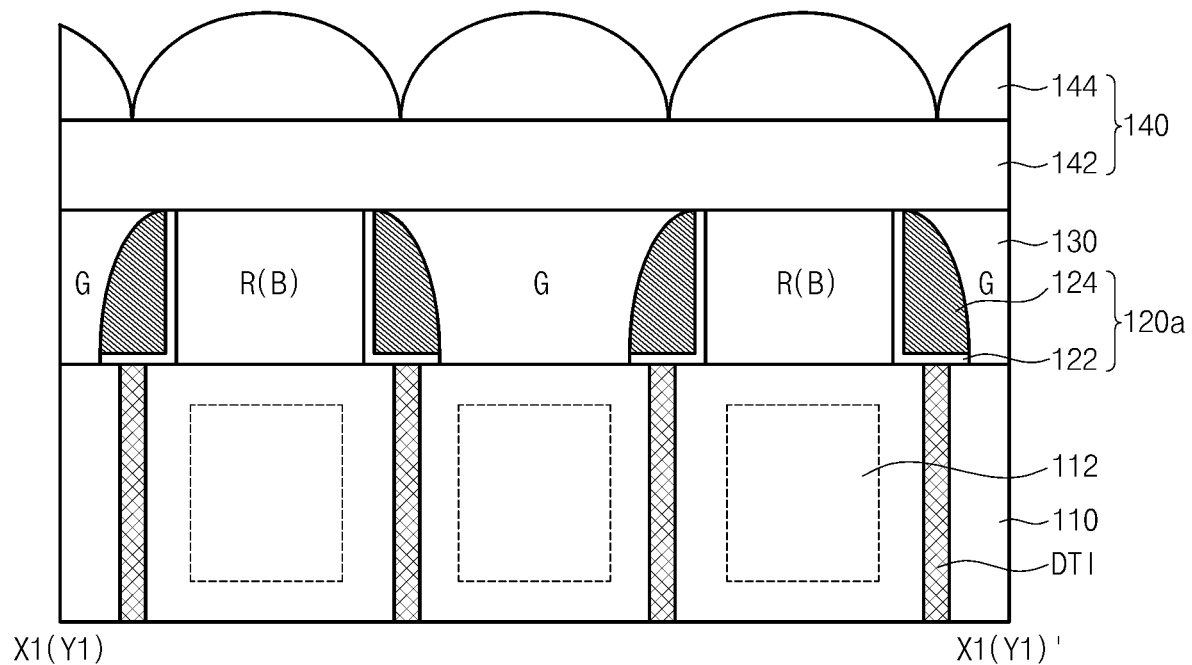

Referring to FIG. 3E, the over-coating layer 142 may be formed over the grid structure 120a and the color filter layer 130. The over-coating layer 142 may include a polymeric material, for example, a polystyrene-based resin, a polyimide-based resin, a polysiloxane-based resin, an acrylic resin, an epoxy-based resin, or a copolymer resin thereof.

Then, after a material layer for a lens is formed over the over-coating layer 142, the lens-material layer is patterned, resulting in formation of a microlens pattern (not shown). In this case, the microlens pattern may be formed in a square island shape. The lens-material layer may have the same materials as those of the over-coating layer 142.

Subsequently, a reflow process is performed on the microlens pattern, resulting in formation of hemispherical microlenses 144 each having a curvature.

Figure 4:
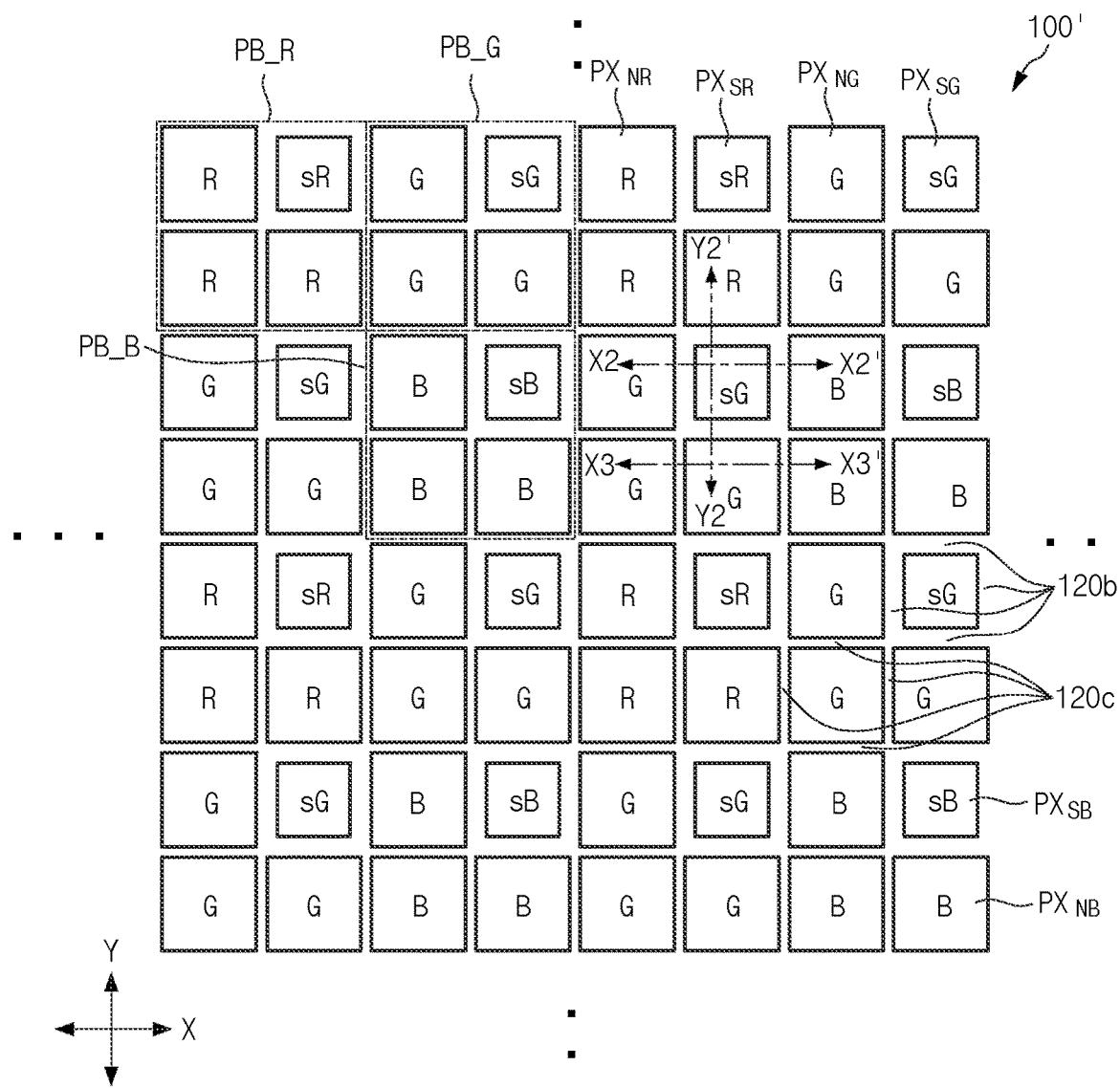
FIG. 4 is a plan view illustrating a planar arrangement structure of a pixel array based on some implementations of the disclosed technology.

FIG. 4 is a plan view illustrating a planar arrangement structure of a pixel array 100' based on some implementations of the disclosed technology.

Referring to FIG. 4, the pixel array 100' may include a quad structure in which four adjacent unit pixels arranged in a (2×2) matrix have the same colors. In an example, such colors are arranged in the Bayer pattern. In some implementations, the unit pixels that are arranged adjacent to each other in the (2×2) matrix while having the same colors may be defined as a sub-pixel block PB_R, PB_G, or PB_B.

Each sub-pixel block PB_R, PB_G, or PB_B may include a short-exposure pixel $PX_{SR}$, $PX_{SG}$, or $PX_{SB}$ for implementing a high dynamic range (HDR). For example, the sub-pixel block PB_R may have a (2×2) matrix structure including three normal pixels $PX_{NR}$ and a short-exposure pixel $PX_{SR}$, the sub-pixel block PB_G may have a (2×2) matrix structure including three normal pixels $PX_{NG}$ and a short-exposure pixel $PX_{SG}$, and the sub-pixel block PB_B may have a (2×2) matrix structure including three normal pixels $PX_{NB}$ and a short-exposure pixel $PX_{SB}$. The short-exposure pixels $PX_{SR}$, $PX_{SG}$, and $PX_{SB}$ may refer to pixels that are formed in a manner that a smaller amount of light can be incident upon the photoelectric conversion elements during the same exposure time as compared to the normal pixels $PX_{NR}$, $PX_{NG}$, and $PX_{NB}$. Thus, the pixel array 100' can generate pixel signals (e.g., normal pixel signals and short-exposure pixel signals) corresponding to different amounts of light even with one time exposure of the pixel array 100' to the light.

In some implementations, the region of the color filter (sR) of the short-exposure pixel $PX_{SR}$ may be smaller in width than the region of each color filter (R) of the normal pixels $PX_{NR}$, the region of the color filter (sG) of the short-exposure pixel $PX_{SG}$ may be smaller in width than the region of each color filter (G) of the normal pixels $PX_{NG}$, and the region of the color filter (sB) of the short-exposure pixel $PX_{SB}$ may be smaller in width than the region of each color filter (B) of the normal pixels $PX_{NB}$. With the smaller width of the short-exposure pixel as compared to that of the normal pixel, a relatively smaller amount of light can penetrate the color filters (sR, sG, sB). For example, the region of a bottom surface of the color filter (sR) may be smaller in width than the region of a bottom surface of the color filter (R), the region of a bottom surface of the color filter (sG) may be smaller in width than the region of a bottom surface of the color filter (G), and the region of a bottom surface of the color filter (sB) may be smaller in width than the region of a bottom surface of the color filter (B).

In some implementations, the pixel array 100' include differently shaped grid structures based on types of pixels in contact with the grid structures. For example, the grid structures included in the pixel array 100' may include grid structures 120b having a sidewall in contact with the color filters (sR, sG, sB) of the short-exposure pixels $PX_{SR}$, $PX_{SG}$, and $PX_{SB}$ and grid structures 120c having both sidewalls in contact with the color filters (R, G, B) of the normal pixels $PX_{NR}$, $PX_{NG}$, and $PX_{NB}$. Thus, the sidewalls of the grid structures 120c are not in contact with the color filters (sR, sG, sB) of the short-exposure pixels $PX_{SR}$, $PX_{SG}$, and $PX_{SB}$. For example, the grid structure 120b has a sidewall in contact with one of the color filters sR, sG, and sB of the short-exposure pixels $PX_{SR}$, $PX_{SG}$, and $PX_{SB}$, and may have a relatively larger width. For example, the grid structure 120c has both sidewalls that are in contact with the color filters R, G, and B of the normal pixels $PX_{NR}$, $PX_{NG}$, and $PX_{NB}$ and have a relatively smaller width. The grid structure 120b may be formed in a shape extending in width toward each of the color filters (sR, sG, sB) such that the region of each of the color filters (sR, sG, sB) can be reduced in size.

In some implementations, the grid structure 120b may include an asymmetric shape or profile. For example, the grid structure 120b may be designed such that the sidewalls contacting the color filters (sR, sG, sB) have a different shape or profile from that of sidewalls contacting the color filters (R, G, B). In some implementations, the grid structure 120c may include a symmetric shape or profile. For example, the grid structure 120c whose both sides are in contact with the color filters (R, G, B) of the normal pixels $PX_{NR}$, $PX_{NG}$, and $PX_{NB}$ may have sidewalls formed in a same shape or profile.

Although the implementation of FIG. 4 illustrates that the sub-pixel block PB_R, PB_G, or PB_B is formed to include the short-exposure pixel $PX_{SR}$, $PX_{SG}$, or $PX_{SB}$ on a one-to-one basis, other implementations are also possible, For example, the short-exposure pixel $PX_{SR}$, $PX_{SG}$, and $PX_{SB}$ may be selectively formed only in some parts of the sub-pixel block PB_R, PB_G, or PB_B for each color. Although the implementation of FIG. 4 illustrates that the short-exposure pixel $PX_{SR}$, $PX_{SG}$, or $PX_{SB}$ is located at the same position in each sub-pixel block PB_R, PB_G, or PB_B, the position of each short-exposure pixel $PX_{SR}$, $PX_{SG}$, or $PX_{SB}$ in the sub-pixel block PB_R, PB_G, or PB_B may be changed.

Figure 5A:
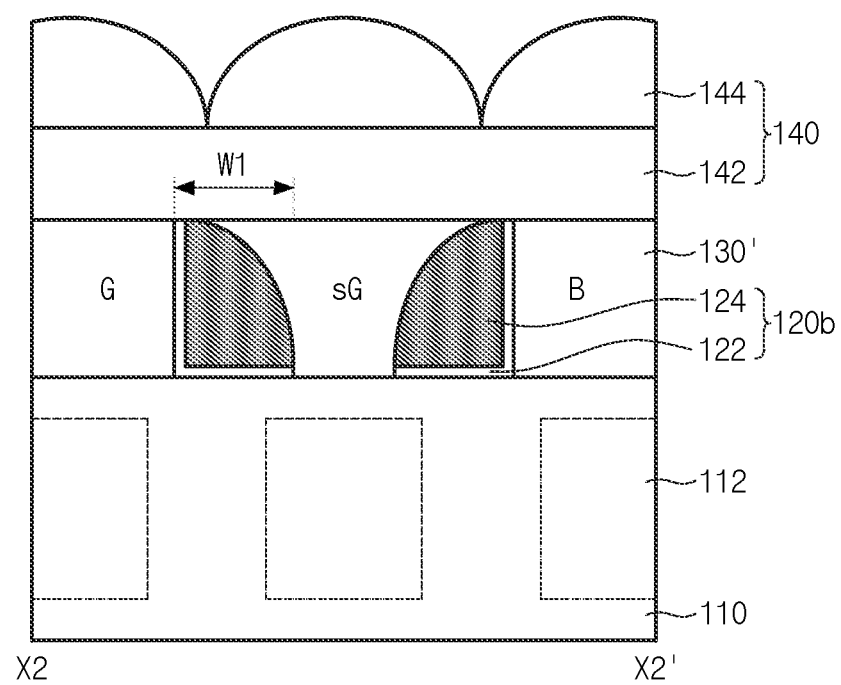
FIG. 5A is a cross-sectional view illustrating an example of a pixel array taken along the line X2-X2' shown in FIG. 4 based on some implementations of the disclosed technology.
Figure 5B:
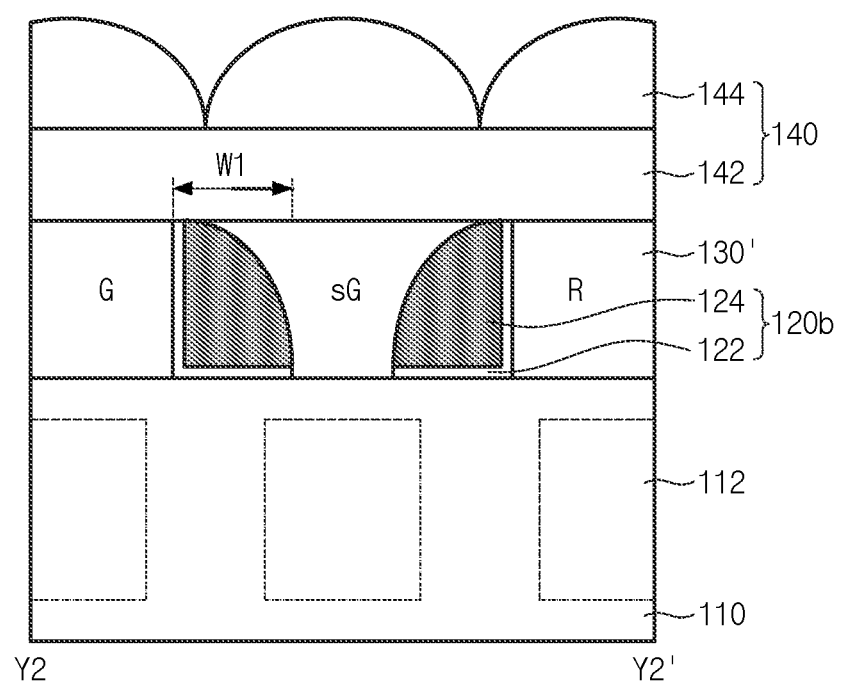
FIG. 5B is a cross-sectional view illustrating an example of a pixel array taken along the line Y2-Y2' shown in FIG. 4 based on some implementations of the disclosed technology.
Figure 5C:
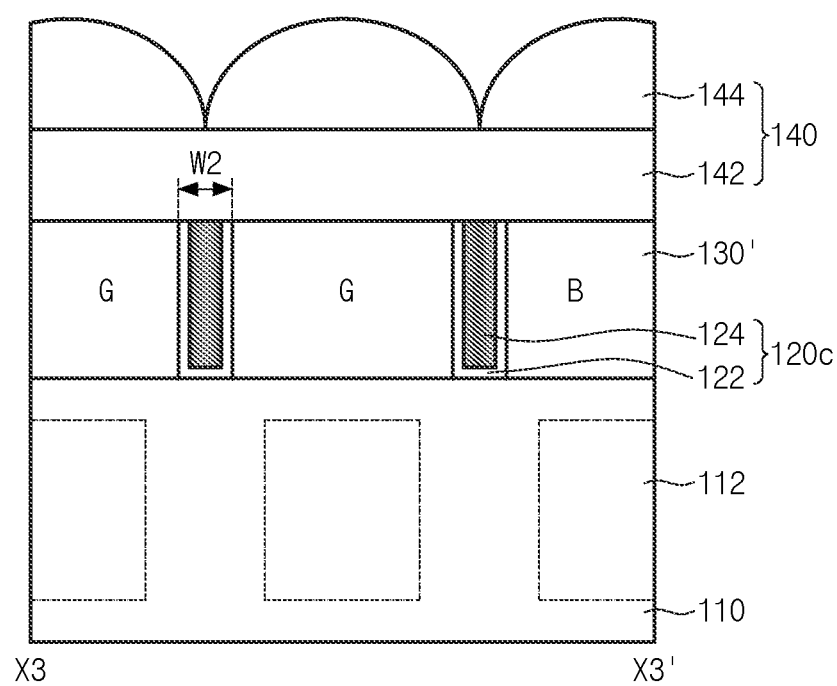
FIG. 5C is a cross-sectional view illustrating an example of a pixel array taken along the line X3-X3' shown in FIG. 4 based on some implementations of the disclosed technology.

FIG. 5A is a cross-sectional view illustrating an example of the pixel array taken along the line X2-X2' shown in FIG. 4. FIG. 5B is a cross-sectional view illustrating an example of the pixel array taken along the line Y2-Y2' shown in FIG. 4. FIG. 5C is a cross-sectional view illustrating an example of the pixel array taken along the line X3-X3' shown in FIG. 4.

A color filter layer 130' may include color filters (R, G, B, sR, sG, sB), each of which allows visible light having a specific color among incident light to pass therethrough and transmits the visible light to the corresponding photoelectric conversion element 112. The color filter (R, G, B) may be arranged in one-to-one correspondence with the normal pixels $PX_{NR}$, $PX_{NG}$, and $PX_{NB}$. The color filters (sR, sG, sB) may be arranged in one-to-one correspondence with the short-exposure pixels $PX_{SR}$, $PX_{SG}$, and $PX_{SB}$.

The grid structures 120b and 120c may be disposed between any two adjacent color filters (R, G, B, sR, sG, sB). In some implementations, the grid structure 120b has a sidewall that is in contact with one of the color filters (sR, sG, sB) as shown in FIGS. 5A and 5B and has a larger width than the grid structure 120c whose sidewalls are in contact with the color filters (R, G, B) as shown in FIG. 5C.

Since the width W1 of the grid structure 120b is larger than the width W2 of the grid structure 120c as described above, the region of a bottom surface of each color filter (sR, sG, sB) surrounded by the grid structure 120b becomes smaller in size than the region of a bottom surface of each color filter (R, G, B) surrounded by the grid structure 120c. Therefore, the amount of light penetrating the color filters (sR, sG, sB) may be smaller than the amount of light penetrating the color filters (R, G, B).

In addition, the grid structure 120b may be formed in an asymmetric profile or shape in which sidewalls contacting the color filter (sR, sG, sB) have a rounded profile and sidewalls contacting the color filter (R, G, B) have a vertical profile. The grid structure 120b may allow incident lights received through the color filters (sR, sG, sB) to be diffusely reflected so that the amount of light incident upon the photoelectric conversion element 112 of each of the short-exposure pixels $PX_{SR}$, $PX_{SG}$, and $PX_{SB}$ can be greatly reduced.

In some implementations, in the grid structure 120b, materials of the sidewalls having a rounded profile may be different in reflection rate (e.g., reflectivity or reflection index) from materials of sidewalls having a vertical profile. For example, the sidewall having a vertical profile may include a first metal layer 122, and the sidewall having a rounded profile may include a second metal layer 124 that has a lower reflectivity than the first metal layer 122. The grid structure 120b may be configured in a manner that incident lights received through the color filters (sR, sG, sB) can be more easily absorbed in the grid structure 120b as compared to incident lights received through the color filters (R, G, B), such that the amount of light incident upon the photoelectric conversion elements 112 of the short-exposure pixels $PX_{SR}$, $PX_{SG}$, and $PX_{SB}$ can be greatly reduced.

Since both sidewalls of the grid structure 120c are in contact with the color filters (R, G, B), the grid structure 120c may be formed in a symmetric profile or shape in which both sidewalls of the grid structure 120c include a vertical profile. In some implementations, both sidewalls of the grid structure 120c may include a first metal layer 122.

The first metal layer 122 may extend to a region between a bottom surface of the second metal layer 124 and the first surface of the semiconductor substrate 110, such that the first metal layer 122 can be in contact with the bottom surface of the second metal layer 124. The first metal layer 122 may include a barrier metal including at least one of titanium (Ti) and titanium nitride (TiN). The second metal layer 124 may include a metal such as tungsten (W).

The above-mentioned structures shown in FIGS. 5A to 5C may be formed by changing the formation positions of the partition patterns shown in FIG. 3A and the spacing between the partition patterns shown in FIG. 3A.

For example, on the first surface of the substrate 110, partition patterns may not be formed in regions to be used for the short-exposure pixels $PX_{SR}$, $PX_{SG}$, and $PX_{SB}$, and may be formed only in regions to be used for the normal pixels $PX_{NR}$, $PX_{NG}$, and $PX_{NB}$. In this case, if the spacing between the partition patterns that are adjacent to each other in X-axis and Y-axis directions is narrow in width, whereas the asymmetric grid structure 120b may be formed in the region including no partition pattern during the etching process of FIG. 3C, most parts of the first and second metal layers 122' and 124' buried in the narrow spacing between the adjacent partition patterns may remain unused without being etched, such that the remaining parts of the first and second metal layers 122' and 124' may be formed as the grid structure 120c in which each of both sidewalls has a vertical profile. Although the grid structure 120c in the vertical cross-sectional view of FIG. 5C is formed in a rectangular shape for convenience of description, an upper portion of the grid structure 120c may also be partially etched in the etching process as necessary.

Although the implementation shown in FIG. 5C illustrates that the grid structure 120c formed between the color filters (R, G, B) of the normal pixels $PX_{NR}$, $PX_{NG}$, and $PX_{NB}$ is formed of or include the metal layers 122 and 124, other implementations are also possible. The implementation of FIG. 5C can also be implemented as a grid structure including air.

Figure 6:
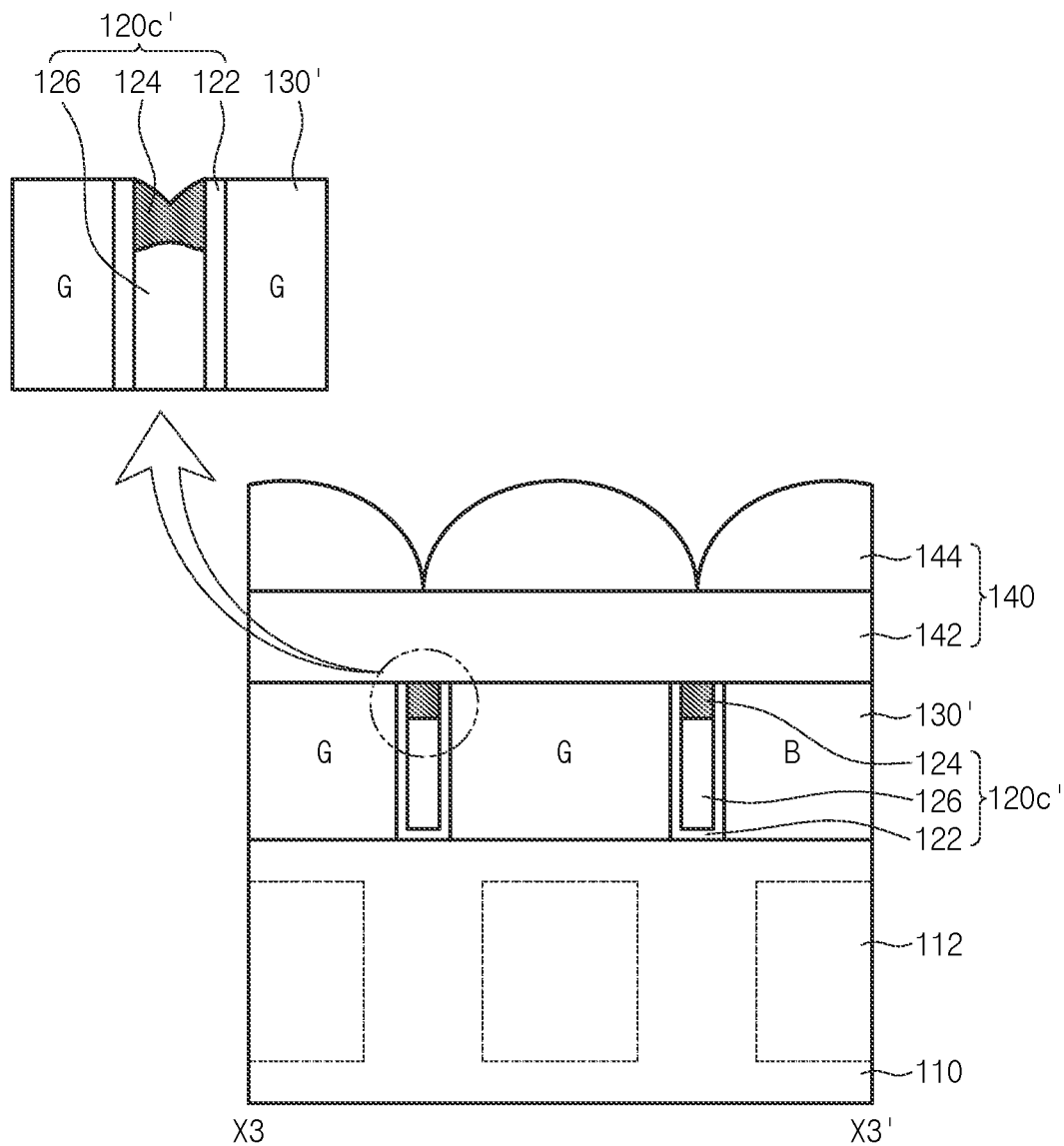
FIG. 6 is a cross-sectional views illustrating an example of a situation in which the grid structure shown in FIG. 5C is formed in an air grid shape based on some implementations of the disclosed technology.

For example, in a situation in which the spacing between the partition patterns that are adjacent to each other in X-axis and Y-axis directions is formed to have a smaller width in the process shown in FIG. 3A, when the second metal layer 124' is formed as shown in the process of FIG. 3B, the second metal layer 124' is unable to completely fill the spacing between the partition patterns and is formed to fill only the upper portion of the corresponding spacing as shown in FIG. 6. By the above-mentioned fabrication methods, a grid structure 120c' including an air layer 126 may be formed between the color filters (R, G, B) of the normal pixels $PX_{NR}$, $PX_{NG}$, and $PX_{NB}$.

As is apparent from the above description, the image sensing device based on some implementations of the disclosed technology can correct a difference in sensitivity between colors of the color filters using a grid structure.

In addition, the image sensing device based on some implementations of the disclosed technology can more easily implement a high dynamic range (HDR) using a grid structure.

Although a number of illustrative embodiments have been described, it should be understood that various modifications to the disclosed embodiments and other embodiments can be devised based on what is described and/or illustrated in this patent document.

What is claimed is:

1. An image sensing device, comprising:
   a semiconductor substrate;
   a plurality of photoelectric conversion elements supported by the semiconductor substrate, each photoelectric conversion element configured to generate an electrical signal corresponding to incident light by performing a photoelectric conversion of the incident light;
   a plurality of color filters disposed over the semiconductor substrate to filter the incident light to be received by the photoelectric conversion elements; and
   a grid structure disposed between the color filters and structured to include asymmetric sidewalls that are shaped based on colors of adjacent color filters among the plurality of color filters,
   wherein the asymmetric sidewalls include a first metal layer that has a first reflectivity and a second metal layer that has a second reflectivity lower than the first reflectivity, and
   wherein the asymmetric sidewalls include:
      a first sidewall including the first metal layer without the second metal layer; and
      a second sidewall opposite to the first sidewall and including the second metal layer.

2. The image sensing device according to claim 1, wherein:
   the first sidewall is configured to have a vertical profile; and
   the second sidewall is configured to have a rounded profile.

3. The image sensing device according to claim 2, wherein:
   the first sidewall is arranged adjacent to color filters other than a green color filter among the plurality of color filters.

4. The image sensing device according to claim 3, wherein:
   the second sidewall is arranged adjacent to the green color filter.

5. The image sensing device according to claim 1, wherein:
   the first metal layer includes at least one of titanium (Ti) or titanium nitride (TiN).

6. The image sensing device according to claim 1, wherein:
   the second metal layer includes tungsten (W).

7. The image sensing device according to claim 1, wherein:
   the first metal layer extends from the first sidewall to the second sidewall to contact with a bottom surface of the second metal layer.

8. An image sensing device, comprising:
   a color filter layer including a plurality of color filters configured to allow light of a same color to pass therethrough and arranged adjacent to each other; and
   a grid structure disposed between the plurality of color filters,
   wherein the plurality of color filters includes:
      a first color filter having a first size; and
      second color filters having a second size greater than the first size,
   wherein the grid structure includes:
      a first grid structure disposed between the first color filter and a second color filter among the second color filters and configured to have a first full width; and
      a second grid structure disposed between the second color filters and configured to have a second full width smaller than the first full width,
   wherein the first grid structure has asymmetric sidewalls.

9. The image sensing device according to claim 8, wherein the asymmetric sidewalls of the first grid structure includes:
   a first sidewall configured to have a vertical profile; and
   a second sidewall opposite to the first sidewall, and configured to have a rounded profile.

10. The image sensing device according to claim 9, wherein:
    the first sidewall is in contact with the second color filters; and
    the second sidewall is in contact with the first color filter.

11. The image sensing device according to claim 9, wherein:
    the first sidewall includes a first metal layer that has a first reflectivity; and
    the second sidewall includes a second metal layer that has a second reflectivity lower than the first reflectivity.

12. The image sensing device according to claim 11, wherein:
    the first metal layer includes at least one of titanium (Ti) or titanium nitride (TiN).

13. The image sensing device according to claim 11, wherein:
    the second metal layer includes tungsten (W).

14. The image sensing device according to claim 11, wherein:
    the first metal layer extends from the first sidewall to the second sidewall to contact with a bottom surface of the second metal layer.

15. The image sensing device according to claim 8, wherein:
    the second grid structure have sidewalls having a vertical profile.

16. The image sensing device according to claim 15, wherein the second grid structure includes:
    first metal layers included in the sidewalls and configured to have a first reflectivity; and
    a second metal layer disposed between the first metal layers, and configured to have a second reflectivity lower than the first reflectivity.

17. The image sensing device according to claim 16, wherein the second grid structure further includes:

an air layer disposed under the second metal layer and between the sidewalls of the second grid structure.

\* \* \* \* \*